United States Patent

Sera et al.

[11] Patent Number: 5,848,462
[45] Date of Patent: Dec. 15, 1998

[54] METHOD FOR MOUNTING AN ELECTRONIC COMPONENT ON A WIRING SUBSTRATE AND AN ILLUMINATING SWITCH UNIT USING THIS MOUNTING METHOD

[75] Inventors: Naoki Sera; Hideki Mitsuoka; Yoshiro Sano; Tetsutaro Nasu, all of Tsuyama, Japan

[73] Assignee: Matsushita Electric Industrial Co., Ltd., Osaka, Japan

[21] Appl. No.: 655,931

[22] Filed: May 31, 1996

[30] Foreign Application Priority Data

Jun. 6, 1995 [JP] Japan ................................. 7-139085

[51] Int. Cl.⁶ .............................. H05K 3/30; H01H 11/00
[52] U.S. Cl. ................................ 29/622; 29/832; 29/842; 156/290; 361/750; 361/762
[58] Field of Search ............................. 29/622, 832, 842, 29/844; 156/257, 290, 308.4, 309.6; 361/761, 762, 764, 750; 228/128

[56] References Cited

U.S. PATENT DOCUMENTS

| | | |
|---|---|---|
| 4,320,272 | 3/1982 | Larson . |
| 4,365,408 | 12/1982 | Dizig ........................................ 29/622 |
| 4,442,938 | 4/1984 | Murphy . |
| 4,449,769 | 5/1984 | Kobayashi et al. ....................... 29/832 |
| 4,772,769 | 9/1988 | Shumate . |
| 4,815,981 | 3/1989 | Mizuno . |
| 4,967,261 | 10/1990 | Niki et al. . |
| 5,331,513 | 7/1994 | Hirai et al. ................................ 29/842 |
| 5,361,491 | 11/1994 | Oomachi et al. . |
| 5,516,988 | 5/1996 | Yamauchi ............................... 361/761 |
| 5,569,886 | 10/1996 | Tanabe et al. . |

FOREIGN PATENT DOCUMENTS

| | | |
|---|---|---|
| 0345427 | 12/1989 | European Pat. Off. . |
| 0347974 | 12/1989 | European Pat. Off. . |
| 4303743 | 8/1993 | Germany . |
| 2-79493 | 3/1990 | Japan . |
| 3-038088 | 2/1991 | Japan . |
| 7-7249 | 1/1995 | Japan . |
| 8801448 | 1/1990 | Netherlands . |
| 2186427 | 8/1987 | United Kingdom . |

*Primary Examiner*—P. W. Echols
*Attorney, Agent, or Firm*—Pollock, Vande Sande & Amernick

[57] ABSTRACT

An insulating film 3 is provided with an opening 4 whose size is substantially equivalent to or slightly smaller than the outer configuration of electronic component 5. A conductive pattern 2 is formed on insulating substrate 1. After forcibly inserting the main body of electronic component 5 into said opening 4, terminals 6 are put between insulating film 3 and insulating substrate 1 and disposed in such a manner that terminals 6 are brought into contact with conductive pattern 2. Then, insulating film 3 is connected with insulating substrate 1 by fusing them in a region surrounding terminals 6, thereby firmly fixing terminals 6 of electronic component 5 on conductive pattern 2.

5 Claims, 5 Drawing Sheets

METHOD FOR MOUNTING AN ELECTRONIC COMPONENT ON A WIRING SUBSTRATE AND AN ILLUMINATING SWITCH UNIT USING THIS MOUNTING METHOD

BACKGROUND OF THE INVENTION

1. Field of the Invention

This invention generally relates to a method for mounting an electronic component on a wiring substrate, preferably applied to electronic components when they are mounted on wiring substrates and incorporated in operational panels for various electronic devices, and also relates to an illuminating switch unit using this mounting method.

2. Prior Art

Recently, to use various electronic devices as portable devices, or to concentrate multiple functions, downsizing of these electronic devices is earnestly requested. In this respect, a need for a flexible wiring substrate (hereinafter referred to as FPC) is rapidly increasing because FPC is thin in width and light in weight, and further FPC assures a flexible wiring on a curved surface or in a narrow space of a given body.

So-called "printed FPC" is a conventionally known FPC which has a base of polyester film and a conductive circuit pattern formed thereon by the screen printing using silver resin group paste. According to such a printed FPC, it is advantageous that FPC itself can be manufactured with low costs, however it is impossible to directly solder electronic components on the silver resin group paste. The Unexamined Japanese Patent Application No. HEI 2-79493, published in 1990, discloses a mounting method applicable to such a printed FPC. According to this mounting method, terminals of various electronic components are connected by conductive adhesive, then the terminals are covered by a reinforcing board. Subsequently, a local melting or partial fusion is caused between a flexible board and the reinforcing board, to mount and fix the electronic components.

Furthermore, the Unexamined Japanese Patent application No. HEI 7-7249, published in 1995, discloses a method of connecting terminals by conductive adhesive, interposing electronic components between upper and lower films, and locally fusing these upper and lower films to mount and fix the electronic components.

However, the above-described electronic component mounting methods have the following disadvantages.

The former mounting method restricts the terminal length of each electronic component. Hence, if a short terminal is used, it will be very difficult to increase the positional accuracy in the mounting operation of an electronic component, and an obtainable fixing strength will be weak.

On the other hand, the latter mounting method requires a wide mounting area and possibly enlarges the overall thickness of the mounting substrate.

SUMMARY OF THE INVENTION

Accordingly, in view of above-described problems encountered in the prior art, a principal object of the present invention is to provide a method for mounting an electronic component on a wiring substrate, which is capable of simplifying the component mounting steps, assuring accuracy in the mounting position, enhancing the reliability in electric conductivity, increasing the fixing strength, and ensuring and facilitating the mounting of each electronic component on the wiring substrate, and further another object of the present invention is to provide an illuminating switch unit using this mounting method.

In order to accomplish this and other related objects, the present invention provides a novel and excellent method for mounting an electronic component on a wiring substrate. According to this method, a main body of an electronic component is forcibly inserted into an opening of an insulating film from the bottom. The electronic component has terminals extending from ends of a bottom surface thereof. The insulating film is made of a resilient member. The opening of the insulating film has a size equivalent to or slightly smaller than the outer configuration of the main body of the electronic component. Then, the electronic component held by the insulating film is placed on an insulating substrate, and the terminals of the electronic component are brought into contact with a conductive pattern formed on the insulating substrate. And finally, the insulating film and the insulating substrate are connected with each other by locally soldering a region surrounding the terminals of the electronic component, thereby mounting the electronic component on the insulating substrate.

According to features of preferred embodiments of the present invention, it is preferable that a thermohardening insulating layer having thermoplastic or heating adhesive property is formed on each of the insulating film and the insulating substrate, and the insulating film and the insulating substrate are connected by locally soldering thermohardening insulating layers formed on the insulating film and the insulating substrate.

It is also preferable that a bendable portion is formed along the opening of the insulating film, so that the main body of the electronic component can be held at its side surfaces to the opening through the bendable portion.

Still further, it is preferable that a recessed portion is formed on the insulating film by embossing finish. This recessed portion has a size equivalent to or slightly smaller than the outer configuration of the main body of the electronic component, and the main body of the electronic component is held in the recessed portion by forcibly entering the main body into the recessed portion.

Yet further, it is preferable that the insulating film holds a light emitting device in the opening, the insulating film comprises a switch portion formed into a collapsible dome shape, a movable contact is attached on the lower surface of the switch portion, terminals of the light emitting device are brought into contact with the conductive pattern, and a stationary contact is provided on the insulating substrate so as to face with the movable contact.

BRIEF DESCRIPTION OF THE DRAWINGS

The above and other objects, features and advantages of the present invention will become more apparent from the following detailed description which is to be read in conjunction with the accompanying drawings, in which.

DETAILED DESCRIPTION OF THE PREFERRED EMBODIMENTS

Figure 1A:
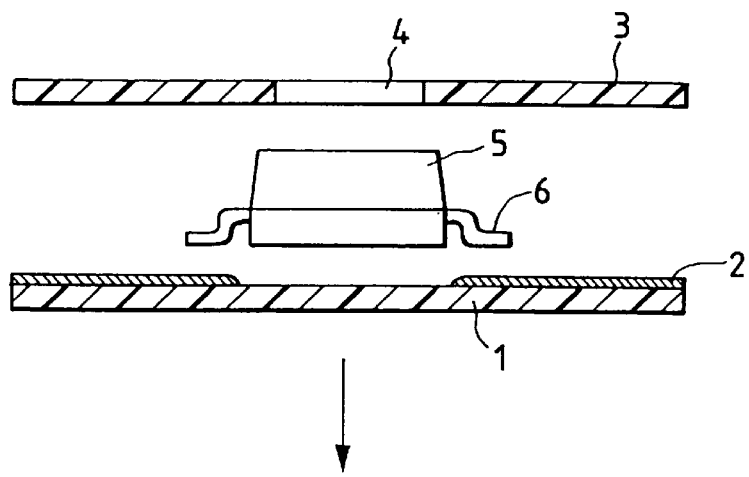
FIGS. 1A through 1C are cross-sectional side views sequentially illustrating a method for mounting an electronic component on a wiring substrate in accordance with a first embodiment of the present invention.

Preferred embodiments of the present invention will be explained in greater detail hereinafter, with reference to the accompanying drawings. Identical parts are denoted by the same identical reference numeral throughout views.

First Embodiment

A method for mounting an electronic component on a wiring substrate will be explained in accordance with a first embodiment of the present invention with reference to FIGS. 1A–1C and 2A–2C.

Figure 2B:
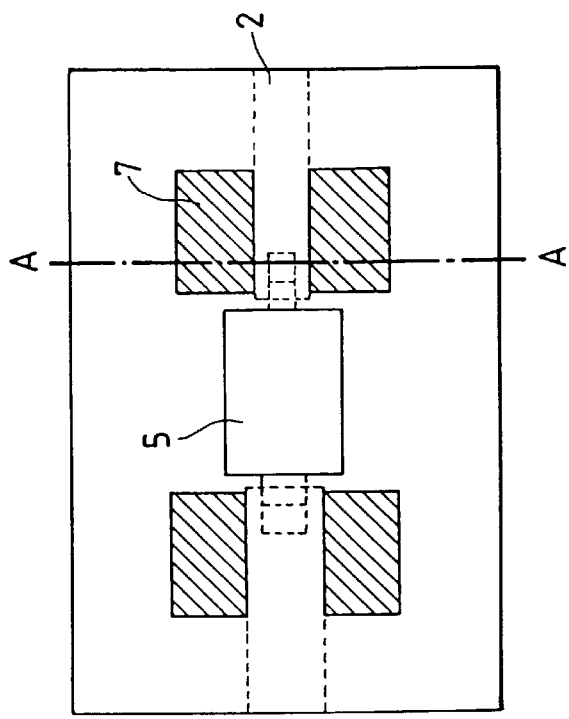
FIG. 2B is a plan view showing the electronic component after it is mounted on the wiring substrate.
Figure 2C:
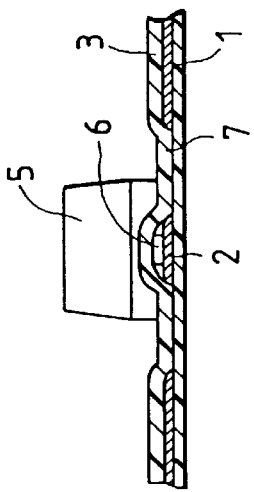
FIG. 2C is a cross-sectional side view, taken along a line A—A of FIG. 2B.
Figure 2A:
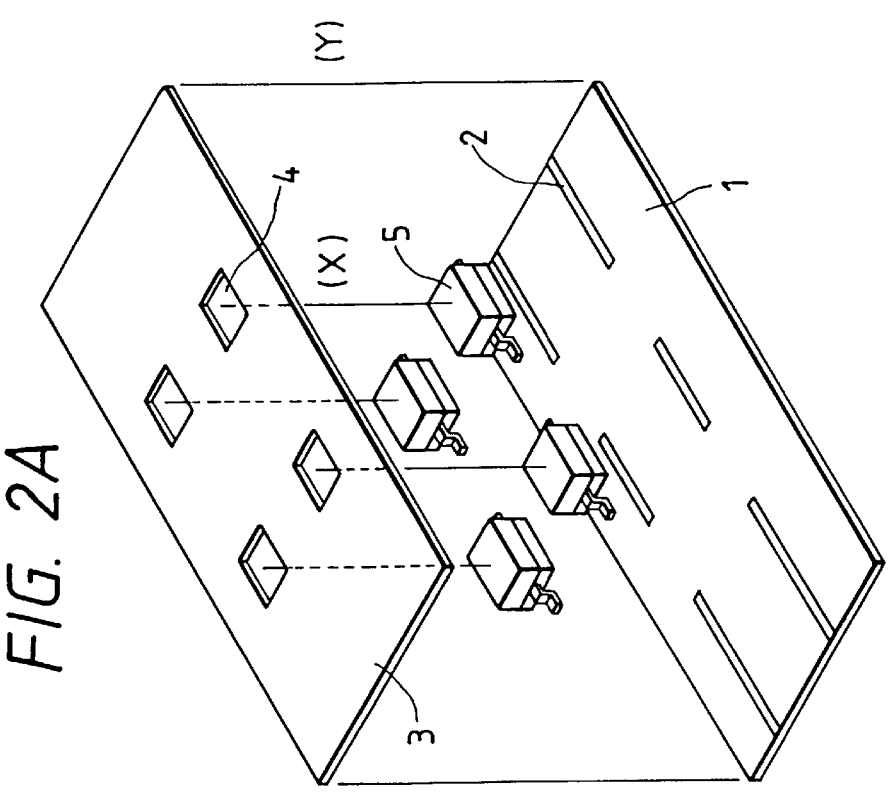
FIG. 2A is a perspective view illustrating the mounting method of the first embodiment of the present invention.

In FIGS. 1A and 2A, reference numeral 1 represents a thermoplastic or thermohardening insulating substrate. A conductive pattern 2 is formed on the upper surface of this insulating substrate 1 by the screen printing or the like. Reference numeral 3 represents a thermoplastic or thermohardening insulating film, which is resiliently deformable. An opening 4 is opened on this insulating film 3. The size of opening 4 is substantially equivalent to or slightly smaller than the outer configuration of the main body of an electronic component 5 which has terminals 6 at opposing ends of the bottom surface thereof.

Figure 1B:
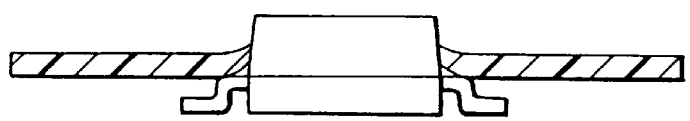
Figure 1C:
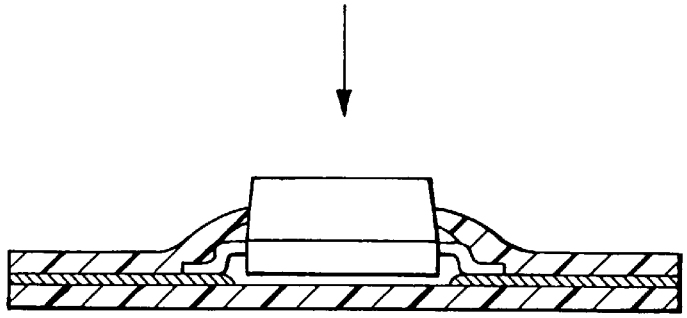

With this arrangement, as shown in FIG. 1B and by an arrow "X" of FIG. 2A, the main body of electronic component 5 is first forcibly inserted or engaged into opening 4 formed on insulating film 3. Next, as shown in FIG. 1C and by an arrow "Y" of FIG. 2A, insulating film 3 is laid or placed on insulating substrate 1 by putting terminals 6 of electronic component 5 between insulating film 3 and insulating substrate 1, so that terminals 6 of electronic component 5 are brought into electrical contact with predetermined positions of conductive pattern 2 on insulating substrate 1. Thereafter, as shown in FIGS. 2B and 2C, insulating film 3 and insulating substrate 1 are locally fused and welded at predetermined welding portions 7 provided in the vicinity of terminals 6. Thus, terminals 6 and conductive pattern 2 are firmly fixed with each other.

As described above, according to the method of mounting an electronic component on a wiring substrate in accordance with the present invention, electronic component 5 is press-fitted into opening 4 provided on insulating film 3 and positioned there. This press-fitting can be easily done without using an expensive mounting machine. And, as shown in later-described Table 1, the mounting accuracy can be maintained in the range of ±0.05 to 0.07 mm. Manufacturing cost can be reduced. Furthermore, as the outer periphery of electronic component 5 is firmly fixed by insulating film 3, the fixing strength of electronic component 5 is increased. A large mechanical pressing strength acting between terminal 6 and conductive circuit pattern 2 makes it possible to use the wiring substrate in a bending condition.

Moreover, compared with the conventional method of covering the entire surface of electronic component 5 by insulating film 3, an overall thickness of the mounting substrate can be reduced by an approximately 10%. When electronic component 5 to be mounted is a light emitting device (hereinafter, referred to LED), undesirable reduction of brightness at the upper surface of the mounting substrate can be effectively prevented.

In this embodiment, materials for insulating substrate 1 and insulating film 3 are polyester such as polyethylene terephthalate, polyimide, polyetherimide, polyetheretherketone, polysulfone, polyethersulfone, polyphenylenesulfide and the like. Meanwhile, conductive pattern 2 is made from conductive paste which includes conductive powder of silver, copper, palladium or the like scattered in polyester resin or epoxy resin, urethane resin or their modified or denatured resin which have better adhesion against insulating substrate 1.

Second Embodiment

Figure 3:
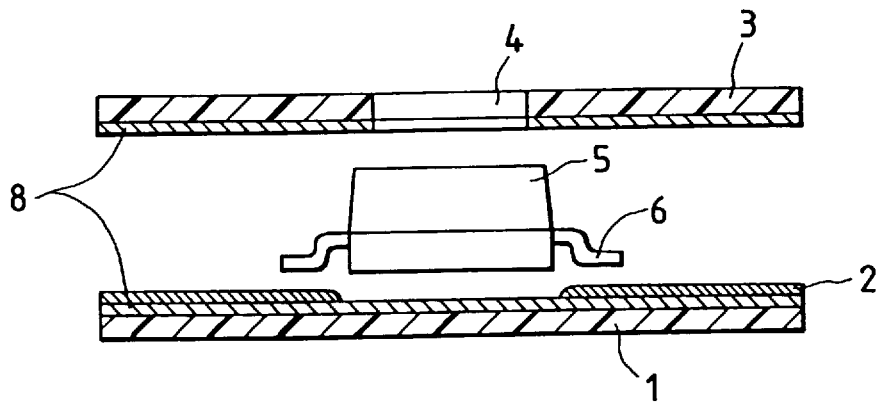
FIG. 3 is a cross-sectional side view illustrating a method for mounting an electronic component on a wiring substrate in accordance with a second embodiment of the present invention.

FIG. 3 shows the arrangement of a second embodiment of the present invention. With reference to this drawing, the characteristic arrangement different from that of the first embodiment will be explained. Thermohardening insulating layer 8, having thermoplastic or heating adhesive property, is formed on each of insulating substrate 1 and insulating film 3. Insulating substrate 1 and insulating film 3 are connected by locally soldering thermohardening insulating layers 8 formed on the confronting surfaces thereof. With this arrangement, connection between insulating substrate 1 and insulating film 3 can be facilitated.

Insulating layer 8 chiefly comprises vinyl chloride resin, vinyl acetate resin, polyester resin, urethane resin, or their modified or denatured resin which have better adhesion against insulating substrate 1 and insulating film 3.

Third Embodiment

Figure 4:
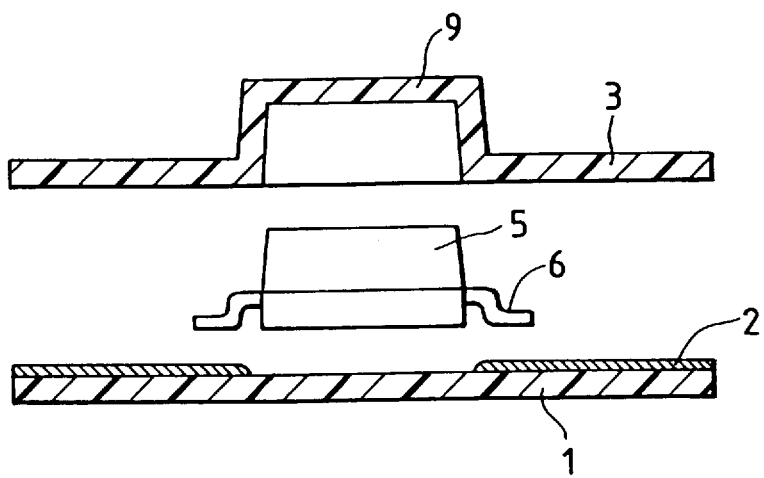
FIG. 4 is a cross-sectional side view illustrating a method for mounting an electronic component on a wiring substrate in accordance with a third embodiment of the present invention.

FIG. 4 shows the arrangement of a third embodiment of the present invention. With reference to this drawing, the characteristic arrangement different from that of the first embodiment will be explained. A recessed portion 9 is formed on insulating film 3 by an embossing finish. This recessed portion 9 serves as a receiver into which the main body of an electronic component 5 is forcibly entered or engaged. Recessed portion 9 has a size equivalent to or slightly smaller than the outer configuration of the main body of electronic component 5, and the main body of electronic component 5 is held in recessed portion 9 by forcibly entering the main body of electronic component into recessed portion 9. With this arrangement, waterproofness and dustproofness of the mounting parts can be assured.

Fourth Embodiment

Figure 5A:
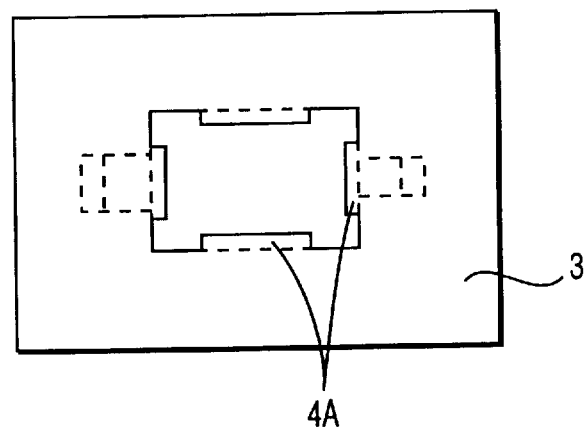
FIGS. 5A and 5B are plan views illustrating a method for mounting an electronic component on a wiring substrate in accordance with a fourth embodiment of the present invention.
Figure 5B:
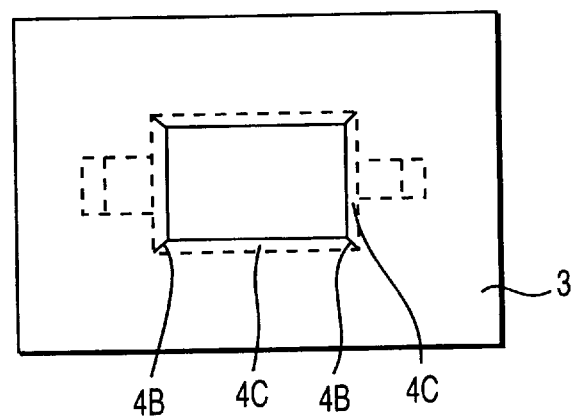

FIGS. 5A and 5B show the arrangement of a fourth embodiment of the present invention. With reference to these drawings, the characteristic arrangement different from that of the first embodiment will be explained. Bendable protrusions 4A are provided partly along the inner peripheral sides of rectangular opening 4 of insulating film 3. Alternatively, slits 4B are provided at four corners of rectangular opening 4 to make sides 4c bendable along the opening 4. With these arrangements, protrusions 4a and sides 4c are flexibly bendable when the main body of electronic component 5 is forcibly inserted or engaged into opening 4, so that electronic component 5 can be firmly held at its side surfaces to the opening 4 through protrusions 4a or sides 4c. With adoption of the arrangement of the fourth embodiment, the mounting accuracy in positioning an electronic component at a designated position is increased by ±0.03 mm.

Table 1 shows the measuring result showing how the configuration of opening 4 gives an effect to the mounting accuracy when an electronic component is forcibly inserted.

TABLE 1

| | | Insulating Film | |
| --- | --- | --- | --- |
| | Material | Thickness ($\mu$m) | Mounting Accuracy (mm) |
| Embodiment 1 | PET | 75 | ±0.07 |
| | | 100 | ±0.06 |
| | | 125 | ±0.05 |
| Embodiment 4 (A) | PET | 125 | ±0.03 |
| Embodiment 4 (B) | | 125 | ±0.03 |
| Comparative Example | | | ±0.10 to ±0.20 |

As apparent from Table 1, providing opening 4 of the fourth embodiment on insulating film 3 assures a mounting accuracy excellent compared with the data of comparative example.

Fifth Embodiment

A fifth embodiment of the present invention will be explained with reference to the drawing.

Figure 6:
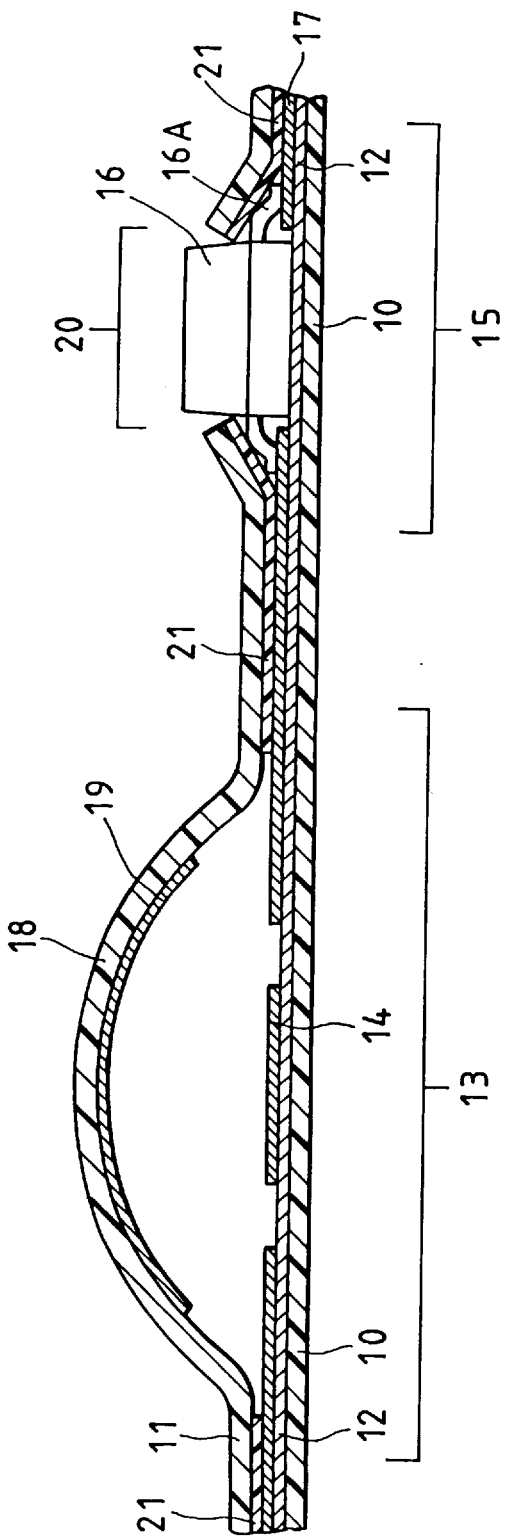
FIG. 6 is a cross-sectional side view illustrating an illuminating switch unit manufactured in accordance with the mounting method of the present invention.

FIG. 6 is a cross-sectional side view showing an illuminating switch unit manufactured by the mounting method for mounting an electronic component on a wiring substrate in accordance with the fifth embodiment.

In the drawing, reference numerals 10 and 11 represent a pair of an insulating substrate and an insulating film, respectively. An insulating layer 12 is uniformly printed on insulating substrate 10 for increasing adhesion of insulating substrate 10. Simultaneously printed on insulating layer 12 are a stationary contact 14 constituting part of a switch 13 and a conductive pattern 17 for a light emitting device (LED) 16 of an illumination 15.

Insulating film 11, made of a resilient member, is provided with a diaphragm 18 at a portion opposed to stationary contact 14 of switch 13. This diaphragm 18 is formed into a dome shape, so as to be collapsible. A conductive layer 19, serving as a movable contact, is attached on the lower surface of diaphragm 18. An opening 20 is provided on insulating film 11 at a position where terminals 16A of LED 16 are brought into contact with conductive pattern 17 of illumination 15. The main body of LED 16 is forcibly entered or engaged into this opening 20.

Forming diaphragm 18 of switch 13 and punching for providing opening 20 of illumination 15 can be performed by sequential press working using the same dies.

Furthermore, an insulating layer 21 is printed partly on the lower surface of insulating film 11 at a region surrounding diaphragm 18 of switch 13 and at a region surrounding terminals 16A of LED 16 of illumination 15. This insulating layer 21 increases the adhesion to insulating layer 12 on insulating substrate 10. Insulating film 11 is welded in the region surrounding terminals 16A of LED 16.

The above-described arrangement for the illuminating switch unit makes it possible to simultaneously form switch 13 and illumination 15 on the same insulating substrate 10 and insulating film 11. Hence, downsizing of a switch unit as well as high densification can be realized, while reducing manufacturing costs.

As apparent from the foregoing description, the present invention makes it possible to easily mount an electronic component on a printed FPC which does not accept the soldering operation, without requiring an expensive mounting machine conventionally used. Thus, the mounting procedure can be simplified. A higher mounting accuracy can be assured even if a terminal of an electronic component is undesirably short. Furthermore, the reliability in electric conductivity is enhanced, and the fixing strength can be increased. Accordingly, it becomes possible to provide an excellent method of mounting an electronic component on a wiring substrate and also it becomes possible to provide an illuminating switch unit manufactured in accordance with this mounting method.

As this invention may be embodied in several forms without departing from the spirit of essential characteristics thereof, the present embodiments as described are therefore intended to be only illustrative and not restrictive, since the scope of the invention is defined by the appended claims rather than by the description preceding them, and all changes that fall within metes and bounds of the claims, or equivalents of such metes and bounds, are therefore intended to be embraced by the claims.

What is claimed is:

1. A method for mounting an electronic component on a wiring substrate, comprising:

forcibly inserting a main body of an electronic component into an opening of an insulating film, said electronic component having terminals extending from a surface thereof, said insulating film being made of a resilient material, said opening having a size substantially equivalent to or slightly smaller than an outer configuration of said main body of said electronic component to obtain a press fit between said main body of said electronic component and said insulating film;

placing said electronic component held by said insulating film on an insulating substrate, and bringing said terminals of said electronic component into contact with a conductive pattern formed on said insulating substrate; and connecting said insulating film and said insulating substrate by locally fusing a region surrounding said terminals of said electronic component, thereby mounting said electronic component on said insulating substrate.

2. The method for mounting an electronic component on a wiring substrate in accordance with claim 1, wherein a thermohardening insulating layer having thermoplastic or heating adhesive property is formed on each of said insulating film and said insulating substrate, whereby said insulating film and said insulating substrate are connected by locally fusing thermohardening insulating layers formed on said insulating film and said insulating substrate.

3. The method for mounting an electronic component on a wiring substrate in accordance with claim 1, wherein a bendable portion is formed along said opening of said insulating film, so that said main body of said electronic component is held at its side surfaces to said opening through said bendable portion.

4. The method for mounting an electronic component on a wiring substrate in accordance with claim 1, wherein a recessed portion is formed on said insulating film by embossing finish, said recessed portion has a size substantially equivalent to or slightly smaller than the outer configuration of said main body of said electronic component, and said main body of said electronic component is held in said recessed portion by forcibly entering said main body into said recessed portion.

5. The method for mounting an electronic component on a wiring substrate in accordance with claim 1, wherein said insulating film holds a light emitting device in said opening, said insulating film comprises a switch portion formed into a collapsible dome shape, a movable contact is attached on the lower surface of said collapsible dome, terminals of said light emitting device are brought into contact with said conductive pattern, a stationary contact is provided on said insulating substrate so as to face said movable contact, and said insulating film is fused in a region surrounding said terminals of said light emitting device.

* * * * *